United States Patent [19]

Misawa et al.

[11] Patent Number: 5,385,851
[45] Date of Patent: Jan. 31, 1995

[54] METHOD OF MANUFACTURING HEMT DEVICE USING NOVOLAK-BASED POSITIVE-TYPE RESIST

[75] Inventors: Hiroto Misawa, Yokohama; Hitoshi Tsuji, Kawasaki, both of Japan

[73] Assignee: Kabushiki Kaisha Toshiba, Kawasaki, Japan

[21] Appl. No.: 75,383

[22] Filed: Jun. 14, 1993

[30] Foreign Application Priority Data

Nov. 30, 1992 [JP] Japan .................. 4-319940

[51] Int. Cl.⁶ .................. H01L 21/306; H01L 21/28
[52] U.S. Cl. .................. 437/40; 437/203; 437/944; 437/184
[58] Field of Search ............ 437/228, 229, 944, 203, 437/187, 912, 41, 40, 184; 148/DIG. 100; 156/644; 257/283, 284

[56] References Cited

U.S. PATENT DOCUMENTS

| | | | |
|---|---|---|---|
| 4,700,462 | 10/1987 | Beaubien et al. | 437/187 |
| 4,771,017 | 9/1988 | Tobin et al. | 437/203 |
| 4,959,326 | 9/1990 | Roman et al. | 437/40 |
| 4,988,609 | 1/1991 | Hashimoto et al. | |
| 5,122,387 | 6/1992 | Takenaka et al. | 427/35 |
| 5,190,892 | 3/1993 | Sano | 437/180 |

FOREIGN PATENT DOCUMENTS

| | | |
|---|---|---|
| 59-232423 | 12/1984 | Japan . |
| 60-100432 | 6/1985 | Japan . |
| 61-166132 | 7/1986 | Japan . |

OTHER PUBLICATIONS

IBM Technical Disclosure Bulletin, "Image Reversal Lift-Off Process Using a Release Layer" vol. 29, No. 11, Apr. 1987, p. 4935.

Wolf, S. and R. Tauber "Silicon Processing for the VLSI ERA", Lattice Press, Sunset Beach, Calif., 1986 p. 518.

Primary Examiner—George Fourson
Assistant Examiner—David M. Mason
Attorney, Agent, or Firm—Finnegan, Henderson, Farabow, Garrett & Dunner

[57] ABSTRACT

In a method of manufacturing a semiconductor apparatus, a resist is coated on a semiconductor substrate and baked. The resist is exposed with an electron beam, and an invertedly tapered opening is formed. Recess etching is performed on the semiconductor substrate through the opening. An electrode is formed at a location determined by the recess etching.

1 Claim, 3 Drawing Sheets

METHOD OF MANUFACTURING HEMT DEVICE USING NOVOLAK-BASED POSITIVE-TYPE RESIST

BACKGROUND OF THE INVENTION

1. Field of the Invention

The present invention relates to a method of manufacturing a semiconductor apparatus in which a fine pattern is formed, and more particularly a method of manufacturing a semiconductor apparatus in which a step of forming a gate electrode of an HEMT (High Electron Mobility Transistor) is improved.

2. Description of the Related Art

In general, in a GaAs device, in particular, an HEMT, in which a transistor is formed on a GaAs substrate, there is a demand that a wide recess structure wherein a recess width is increased to enhance a Schottky reverse breakdown voltage be employed and that the gate length be decreased to reduce a noise factor (NF). In the prior art, to meet the demand, a fine resist pattern having an invertedly tapered cross section is formed such that a first electron beam exposure is performed in patterning a resist which will serve as an etching mask for etching a recess, and then a second electron beam exposure is performed in patterning a resist which will serve as an etching mask for forming a gate electrode.

The two-step electron beam exposure requires several hours, and a so-called "through-put" which indicates the efficiency of processing wafers in a unit time is degraded. In addition, owing to an alignment error due to the two-step electron beam exposure, the alignment between the recess and gate electrode cannot exactly be controlled. These drawbacks are found both in the case of forming a straight-type gate electrode of HEMT and in the case of forming a T-type gate electrode.

Referring to FIGS. 1 to 6 and FIGS. 7 to 16, examples of a two-step electron beam exposure in steps of forming straight-type and T-type gate electrodes of a conventional HEMT will now be described.

FIGS. 1 to 6 are cross-sectional views showing the steps of manufacturing a conventional HEMT in the case of forming a straight-type gate electrode.

As is shown in FIG. 1, a buffer epitaxial layer 41 is formed on the surface of a GaAs substrate 40. A secondary electron supply epitaxial layer 42 is formed on the buffer epitaxial layer 41. A cap epitaxial layer 43 is formed on the secondary electron supply epitaxial layer 42. A positive-type first electron beam resist 44 is coated on the cap epitaxial layer 43, and the resultant structure is subjected to baking treatment.

The resist 44 is subjected to first electron beam exposure in order to form a pattern which will serve as an etching mask for a recess etching step. An exposed region of the resist 44 is denoted by numeral 44a.

Subsequently, development, washing and drying (so-called "step (multi) development treatment") is performed at least once. Thus, as shown in FIG. 2, an opening 45 having an invertedly tapered cross section is formed in the resist 44. Then, recess etching is performed to form a groove 46 in a surface portion of the resultant structure.

After the resist 44 is removed, a second electron beam resist 47 for lift-off is coated and baked, as shown in FIG. 3.

A second electron beam exposure step is performed on the resist 47 to form a pattern which will serve as an etching mask for forming a gate electrode. An exposed region of the resist 47 is denoted by numeral 47a.

Subsequently, development, washing and drying is performed, as shown in FIG. 4, to form an opening 48 having an invertedly tapered cross section in the resist 47.

Then, as shown in FIG. 5, a metal wiring layer 49 for forming a gate electrode is deposited on the entire surface of the substrate.

As shown in FIG. 6, a portion (which will become a gate electrode G of the HEMT) of the metal wiring layer 49, which is deposited on the bottom of the opening 48, is left, and the second electron resist 47 and the unnecessary metal wiring layer 49 on the resist 47 are removed by a lift-off method.

Symbols S and D denote a source region and a drain region of an HEMT formed by an ordinary process.

FIGS. 7 to 16 are cross-sectional views showing the steps of manufacturing a conventional HEMT device for forming a T-type gate electrode.

As is shown in FIG. 7, a positive-type first electron beam resist 54 is coated on a GaAs substrate 50 and baked, and an electron beam exposure step, as shown in FIG. 1, is performed on the resist 54.

FIG. 8 shows a step in which the resist which was subjected to the electron beam exposure is developed and a very small opening 55 is formed in part of the resist.

Recess etching is performed by putting a phosphate liquid in the opening 55, as shown in FIG. 9, thereby forming a groove 56 in a surface portion of the substrate.

Subsequently, as shown in FIG. 10, a first metal wiring layer 59a, having a relatively high melting point, for forming a lower part of a T-type gate electrode is deposited on the entire surface of the substrate. A novolak-based positive-type second electron beam resist 57 is coated on the first metal wiring layer 59a and baked.

A second electron beam exposure is performed on the second resist 57, as shown in FIG. 11.

The second electron beam resist 57 which was subjected to the second electron beam exposure is developed and a relatively large opening 58 having an invertedly tapered cross section is formed in part of the resist.

A second metal wiring layer 59b for forming a gate electrode is deposited on the entire surface of the resultant structure, as shown in FIG. 13.

As is shown in FIG. 14, a portion (which will become a gate electrode G of the HEMT) of the second metal wiring layer 59b, which is deposited on the bottom of the opening 58, is left, and the second electron resist 57 and the unnecessary metal wiring layer 59 on the resist 57 are removed by a lift-off method.

Subsequently, as is shown in FIG. 15, the exposed portion of the first metal wiring layer 59a is etched away by a dry etching method (e.g. RIE (Reactive Ion Etching)), and the first resist 54 is lifted off, as shown in FIG. 16.

When the aforementioned resist pattern, which will become the etching mask for forming the T-type gate electrode of the HEMT, is formed, the two-step electron beam exposure is performed to form the very small opening 55 in the first electron beam resist 54 for forming the lower part of the T-gate electrode and to form the relatively large opening in the second electron beam resist 57 for forming the upper part of the T-gate electrode. Thus, the through-put is deteriorated.

Further, when the pattern (upper resist pattern) of the second electron beam resist 57 for forming the upper part of the T-gate electrode is formed, it must be aligned with the pattern (lower resist pattern) of the first electron beam resist 54 for the lower part of the T-gate electrode. Depending on the precision of alignment of patterns, a displacement may occur between the upper part and lower part of the T-gate electrode.

After the formation of the pattern of the lower resist 54 is completed, it is necessary to interpose a stopper layer 59a between the two resist layers to protect the lower resist pattern against the electron beam for forming the pattern of the upper resist 57. As a result, it becomes necessary to provide an outgassing countermeasure to a gas occurring from the lower resist 54. Thus, the manufacturing process becomes more complex.

As regards either the straight-type gate electrode or T-gate electrode of the conventional HEMT, the two-step electron beam exposure must be performed in the recess etching step and the gate electrode forming step in the resist-patterning process. Thus, the through-put is degraded and the positional displacement between the recess groove and gate electrode occurs.

SUMMARY OF THE INVENTION

The object of the present invention is to eliminate the above drawbacks and to provide a method of manufacturing a semiconductor apparatus, wherein by a single step of electron beam exposure, recess etching is performed and a gate electrode is formed by making use of a recess formed by the recess etching.

In order to achieve the above object, there is provided a method of manufacturing a semiconductor apparatus, comprising the steps of:

coating a resist on a semiconductor substrate and baking the resist;

exposing the resist with an electron beam;

forming an opening with an invertedly tapered shape in the resist by said exposure;

performing recess etching on the resultant structure through the opening; and forming a gate electrode at a position determined by the recess etching step.

According to this method, when a fine pattern with an opening of an invertedly tapered cross section is formed in a resist, a recess etching step and a step of forming an aligned gate electrode can be formed by a single step of exposure with an electron beam. Thus, the time for electron beam exposure can be reduced by several hours, and the through-put can be remarkably increased. Furthermore, since the alignment between the recess etching width and the gate electrode can be exactly controlled and the yield and productivity can be remarkably enhanced.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will now be described with reference to the accompanying drawings.

FIGS. 17 to 22 illustrate the steps of forming a straight-type gate electrode of an HEMT.

Figure 1:
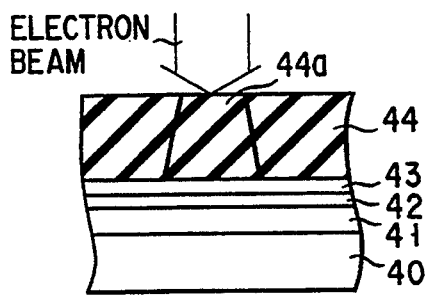
FIGS. 1 to 6 illustrate a conventional process of manufacturing a straight-type gate electrode of an HEMT.
Figure 2:
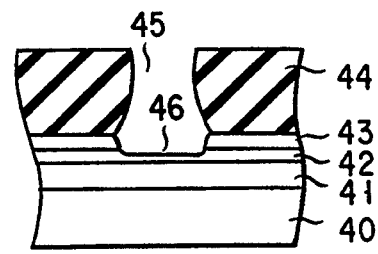
Figure 3:
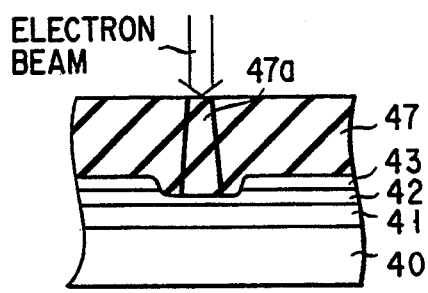
Figure 4:
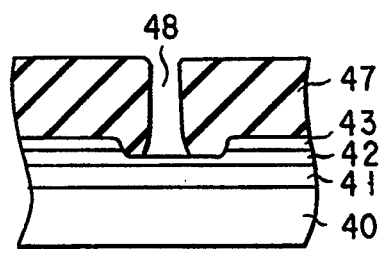
Figure 5:
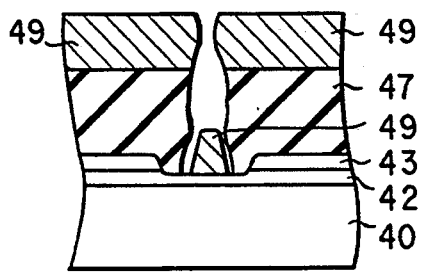
Figure 6:
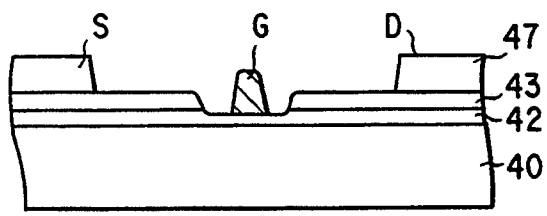
Figure 7:
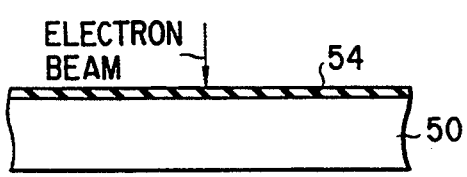
FIGS. 7 to 16 illustrate a conventional process of manufacturing a T-type gate electrode of an HEMT.
Figure 8:
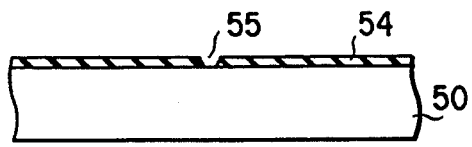
Figure 9:
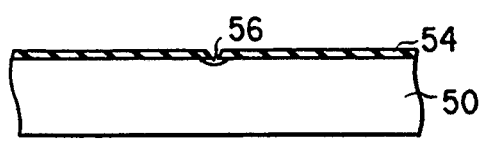
Figure 10:
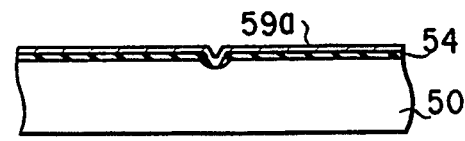
Figure 11:
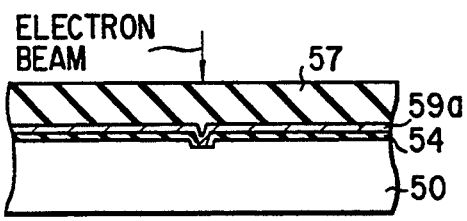
Figure 12:
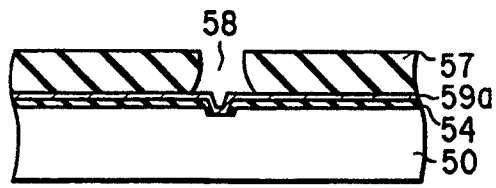
Figure 13:
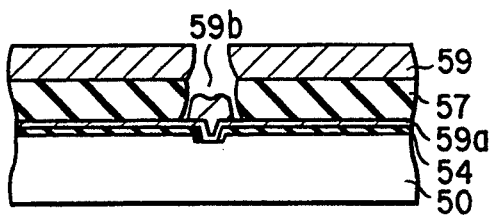
Figure 14:
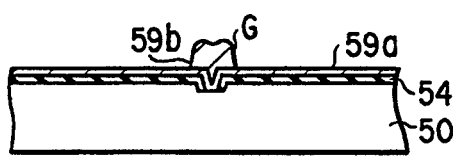
Figure 15:
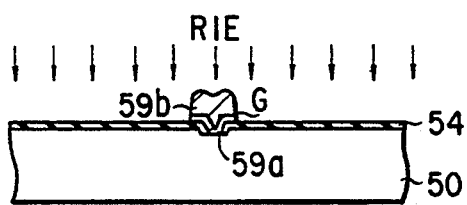
Figure 16:
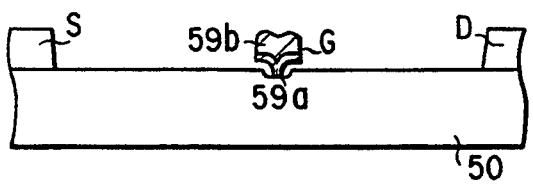
Figure 17:
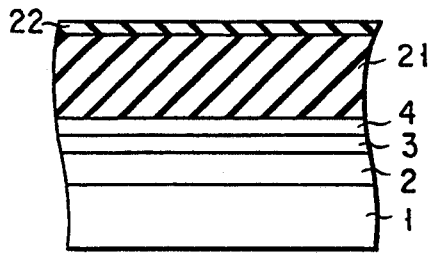
FIGS. 17 to 22 show an embodiment of a method of manufacturing a semiconductor apparatus, according to the present invention, and illustrate the steps of forming a straight-type gate electrode of an HEMT.

As is shown in FIG. 17, a buffer epitaxial layer 2 is formed on the surface of a GaAs substrate 1. A secondary electron supply epitaxial layer 3 is formed on the buffer epitaxial layer 2. A cap epitaxial layer 4 is formed on the secondary electron supply epitaxial layer 3. A novolak-based positive-type resist 21 for an electron beam, e.g. OEBR-2000 (manufactured by Tokyo Oka Kogyo), is coated on the resultant structure to a thickness of 1 $\mu$m, and the resultant structure is baked at 80° C. for 90 seconds.

The resultant structure is dipped for 30 seconds an inorganic alkali aqueous solution (developing liquid), e.g. TFD-3 (23° C.) manufactured by Tokyo Oka Kogyo. Then, the structure is washed with water for 30 seconds and dried by air blow. Thus, a hardly soluble layer 22 is formed on the resist surface.

Figure 18:
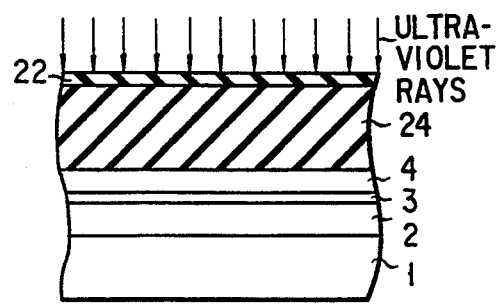

As is shown in FIG. 18, the entire surface of the resist is exposed to, e.g. ultraviolet rays with radiation energy of 0.06–0.2 mJ/cm$^2$. The region exposed by ultraviolet is denoted by numeral 24. The exposure to ultraviolet rays is completed in several seconds.

Figure 19:
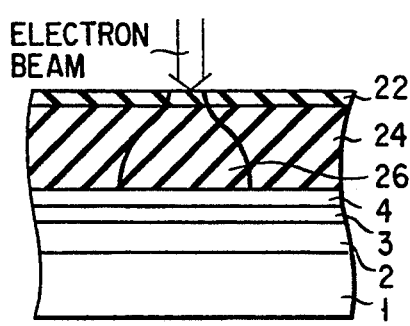

As is shown in FIG. 19, the ultraviolet-exposed region 24 of the resist 21 is exposed to an electron beam. The beam-exposed region is denoted by numeral 26. In this case, the exposed region 26 of the resist 21 has been sensitized to a certain extent by the ultraviolet rays, and the sensitivity to the electron beam has been enhanced. Thus, the electron beam exposure can be performed with a less beam dosage than an electron beam employed to form a conventional gate electrode, and thereby the exposure time can be decreased. In addition, since the hardly soluble layer 22 is formed before the total exposure, reduction in size of the resist 21 due to total exposure, as well as an increase in size of the opening, can be prevented.

Figure 20:
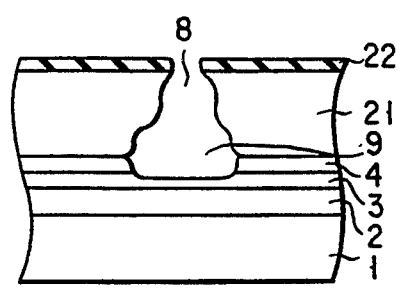

Subsequently, as shown in FIG. 20, the step (multi) development treatment, in which water washing and drying is performed after the resist 21 is developed with an alkali aqueous solution, is performed at least once. Thereby, while a hardly soluble layer is being formed on the resist surface and the side wall of the opening, the opening 8 having an invertedly tapered shape is formed in the resist 21.

Suppose that the step (multi) development treatment is performed three times. In the first step (multi) development treatment, the structure is dipped for 30 seconds in the alkali aqueous solution TFD-3 (23° C.), following which it is washed with water for 30 seconds and dried by air blow. In the second step (multi) development treatment, the structure is dipped in TFD-3 (23° C.) for 60 seconds, following which it is washed with water for 30 seconds and dried by air blow. In the third step (multi) development treatment, too, the structure is dipped in TFD-3 (23° C.) for 60 seconds, following which it is washed with water for 30 seconds and dried by air blow.

In this case, by virtue of the hardly soluble layer 22 formed on the resist surface, the width of the upper part of the opening 8 becomes small. In addition, the electron beam-sensitized region increases as a result of the total surface exposure with ultraviolet rays. Furthermore, development is performed while the hardly soluble layer 22 is being formed on the resist surface and the side wall of the opening, and therefore the area of the bottom part of the opening 8 increases.

Then, the recess etching is performed to form a groove 9 in a surface portion of the resultant structure, with a phosphate liquid put in the opening 8.

Figure 21:
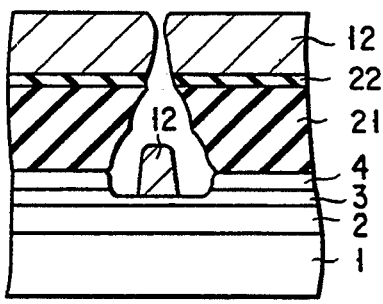

Subsequently, as shown in FIG. 21, a metal wiring layer 12 for forming a gate electrode is deposited on the entire surface of the resultant structure.

Figure 22:
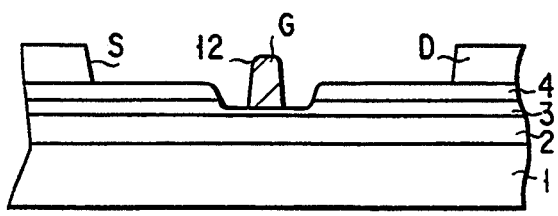

As is shown in FIG. 22, a portion G (which will become a gate electrode G of the HEMT) of the metal wiring layer 12, which is deposited on the bottom of the opening, is left, and the electron beam resist 21 and the unnecessary metal wiring layer 12 on the resist 21 are removed by a lift-off method.

Symbols S and D denote a source region and a drain region of an HEMT formed by an ordinary process.

According to the method of the first embodiment, a fine pattern with the opening 8 of an invertedly tapered cross section (overhand shape cross section) can be formed in the resist 21 by exposure of the resist 21 with ultraviolet rays and a single step of exposure with electron beam. Thus, the time for electron beam exposure can be reduced, and the through-put can be remarkably increased.

Furthermore, since the wide recess groove 9 and gate electrode G can be formed by self-alignment, the alignment between the recess etching width and the gate electrode can be exactly controlled and the yield and productivity can be remarkably enhanced.

FIGS. 23 to 29 are cross-sectional views showing the steps of manufacturing a T-type gate electrode according to the second embodiment of the invention.

Figure 23:
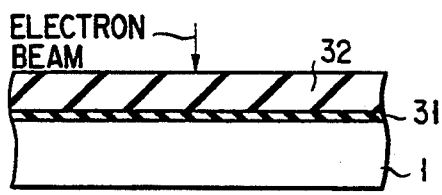
FIGS. 23 to 29 show another embodiment of the method of manufacturing a semiconductor apparatus, according to the present, and illustrate the steps of forming a T-type gate electrode of an HEMT.

As is shown in FIG. 23, a positive-type first electron beam resist 31, e.g. ZEP520-12 (manufactured by Nippon Zeon), is coated on a GaAs substrate 1 to a thickness of 200 nm and baked for two minutes at 170° C. Further, a positive-type second electron beam resist 32, e.g. OEBR-2000 (manufactured by Tokyo Oka Kogyo) for 90 seconds, is coated on the resultant structure to a thickness of 600 nm and baked for 90 seconds at 80° C.

The two electron beam resists 32 and 31 are directly exposed with an electron beam (a dosage of e.g., 9 nC/cm).

Figure 24:
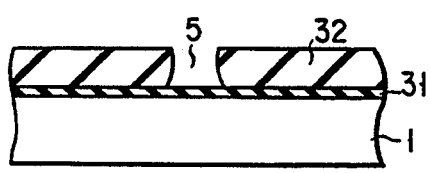

Subsequently, as shown in FIG. 24, the second electron beam resist 32 after the electron beam exposure is developed, and a first opening 5 (the width of the opening: about 0.7 micron), which has an invertedly tapered shape and is completely separated from the first electron beam resist 31, is formed in part of the resist 32. In this case, the development is performed by using an alkali developing liquid (e.g. AZ Developer manufactured by Hoechst Japan Ltd. or TFD-3 manufactured by Tokyo Oka Kogyo).

Figure 25:
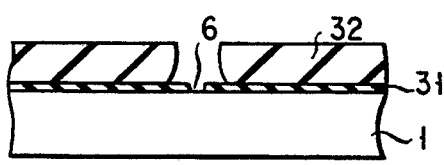

Further, as shown in FIG. 25, the first electron beam resist 31 at the bottom of the first opening 5 is developed, and a second opening 6 having an opening width (e.g. about 0.15 micron) less than the opening width of the first opening 5 is formed. In this case, development is performed by using an organic developing liquid (e.g. ZEP-RD manufactured by Nippon Zeon).

Figure 26:
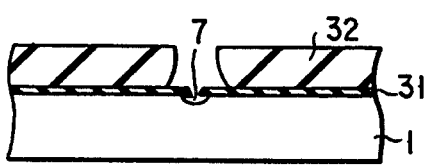

As is shown in FIG. 26, recess etching is performed with a phosphate liquid put in the two openings 5 and 6, thus forming a groove 7 in a surface portion of the substrate.

Figure 27:
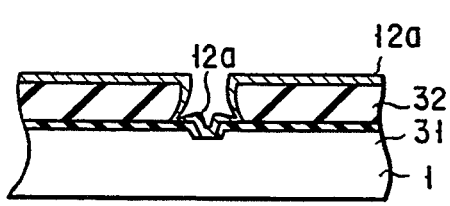
Figure 28:
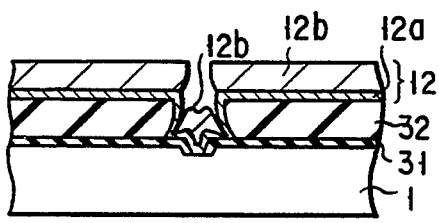

Subsequently, a metal wiring layer for forming a gate electrode is deposited on the surface of the substrate. In this case, as shown in FIG. 27, TiW is deposited to a thickness of 20 nm as the first metal wiring layer 12a having a relatively high melting point. Then, as shown in FIG. 28, for example, Ti and Au are successively deposited as a second metal wiring layer 12b.

Figure 29:
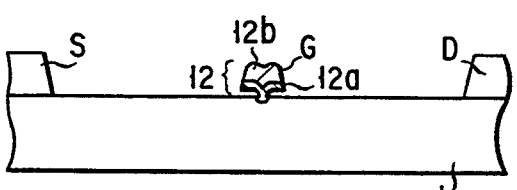

As is shown in FIG. 29, a portion G (which will become a T-type gate electrode G of the HEMT) of the metal wiring layer 12 (12a, 12b), which is deposited on the bottom of the opening 5, is left, and the second electron beam resist 32 and the unnecessary metal wiring layers (second metal wiring layer 12b and first metal wiring layer 12a) are removed by a lift-off method.

Symbols S and D denote a source region and a drain region of an HEMT formed by an ordinary process.

According to the method of the second embodiment, the two resists 32 and 31 are subjected to a single exposure step with an electron beam. Therefore, the very fine opening 6 can be formed in the lower resist 31, and the relatively large opening 5 having an invertedly tapered shape can be formed in the upper resist 32 in the state in which the opening 5 is completely separated from the lower resist 31.

Thereby, the resist pattern which will become the etching mask in the case of forming the T-type gate electrode G of the HEMT can be formed.

Since the electron beam exposure is performed only once, the through-put is remarkably enhanced, non-alignment between the upper resist pattern and lower resist pattern does not occur, and no displacement occurs between the upper part and lower part of the T-type gate.

Besides, since the first metal wiring layer 12a serving as stopper for an electron beam is deposited after the openings 5 and 6 are formed in the two resists 32 and 31, it is not adversely affected by outgassing from the lower resist 31. Since no countermeasure to outgassing is required, the manufacturing process does not become complex.

Figure 30:
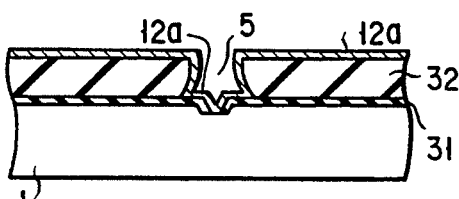
FIGS. 30 to 32 show a modification of some of the steps shown in FIGS. 23 to 29.
Figure 31:
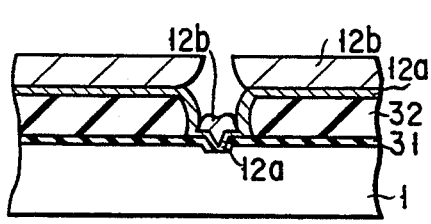

There is a case in which the first metal wiring layer 12a is deposited continuously on the bottom and side wall of the opening 5, as shown in FIG. 30. In this case, as is shown in FIG. 31, the exposed portion of the first metal wiring layer 12a on the bottom of the opening 5 may not completely be removed by the lift-off method, after the second metal wiring layer 12b was deposited.

Figure 32:
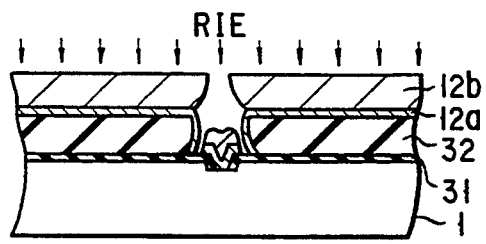

In order to solve this problem, the exposed portion of the first metal wiring layer 12a may be etched by a dry etching method (e.g. RIE), as shown in FIG. 32, and the second electron beam resist 32 and the unnecessary metal wiring layer (second metal wiring layer 12b and first metal wiring layer 12a) on the resist 32 can be removed by the lift-off method.

As has been described above, according to the above embodiment, the two resists are subjected to a single exposure step with an electron beam. Therefore, the very fine opening can be formed in the lower resist, and the relatively large opening having an invertedly tapered shape can be formed in the upper resist in the state in which the opening is completely separated from the lower resist.

In addition, since the electron beam exposure is performed only once to form the resist pattern, which will serve as the etching mask for forming the gate electrode, the through-put is remarkably enhanced, non-alignment between the upper resist pattern and lower resist pattern does not occur, and no displacement occurs between the upper part and lower part of the T-type gate.

Furthermore, since the first metal wiring layer serving as stopper for an electron beam is deposited after the openings are formed in the two resists, it is not adversely affected by outgassing from the lower resist. Since no countermeasure to outgassing is required, the manufacturing process does not become complex.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor apparatus, comprising the steps of:

coating a novolak-based positive-type electron beam resist on a GaAs substrate and baking the resultant structure;

forming a first layer on the surface of the electron beam resist, by dipping the GaAs substrate in an alkali aqueous solution, washing the resultant structure with water and drying the resultant structure;

exposing the surface of the electron beam resist with ultraviolet rays through the first layer;

exposing the surface of the electron beam resist directly with an electron beam, following the step of exposing the surface of the electron beam resist with the ultraviolet rays;

forming an opening having an invertedly tapered shape in part of the surface of the electron beam resist, by developing the electron beam resist with an alkali aqueous solution, following which a step of water washing and drying is performed at least once;

subjecting the resultant structure to recess etching through the opening;

depositing on the entire surface of the resultant structure a metal wiring layer for forming an electrode;

leaving a portion of the metal wiring layer, which will serve as a straight-type gate electrode of an HEMT, and removing the electron beam resist and the metal wiring layer which are not needed; and forming a source electrode and a drain electrode at predetermined locations on the semiconductor resultant structure.

* * * * *